(12) United States Patent
Yu et al.

(10) Patent No.: US 11,533,075 B1
(45) Date of Patent: Dec. 20, 2022

(54) INTERFACE FOR A TRANSCEIVER

(71) Applicant: QUALCOMM Incorporated, San Diego, CA (US)

(72) Inventors: Xinmin Yu, San Diego, CA (US); Bon-Hyun Ku, San Diego, CA (US); Yunfei Feng, San Diego, CA (US); Chuan Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/478,163

(22) Filed: Sep. 17, 2021

(51) Int. Cl.
*H04B 1/40* (2015.01)
*H03F 3/24* (2006.01)

(52) U.S. Cl.
CPC ............... *H04B 1/40* (2013.01); *H03F 3/245* (2013.01); *H03F 2200/294* (2013.01); *H03F 2200/451* (2013.01)

(58) Field of Classification Search
CPC . H04B 1/40; H04B 1/401; H04B 1/44; H04B 1/581; H03F 3/245; H03F 2200/294; H03F 2200/451
See application file for complete search history.

(56) References Cited

U.S. PATENT DOCUMENTS

| | | | |
|---|---|---|---|
| 10,581,478 B1 * | 3/2020 | Tam .................... | H04B 1/0458 |
| 2020/0083924 A1 * | 3/2020 | Callender .............. | H03F 3/21 |
| 2020/0106474 A1 * | 4/2020 | Hur ........................ | H04L 5/14 |
| 2020/0403584 A1 * | 12/2020 | Varonen ................ | H03F 3/21 |
| 2022/0123695 A1 * | 4/2022 | Tang ...................... | H04B 1/18 |

* cited by examiner

*Primary Examiner* — Nguyen T Vo

(74) *Attorney, Agent, or Firm* — Loza & Loza, LLP/Qualcomm Incorporated

(57) ABSTRACT

An apparatus includes a transformer including a first inductor, a second inductor, and a third inductor. The apparatus also includes a power amplifier having an output coupled to the first inductor, a low-noise amplifier having an input coupled to a first terminal of the third inductor, and a fourth inductor having a first terminal and a second terminal, wherein the second terminal of the fourth inductor is coupled to a second terminal of the third inductor. The apparatus also includes a switch coupled between the first terminal of the third inductor and the first terminal of the fourth inductor.

30 Claims, 13 Drawing Sheets

INTERFACE FOR A TRANSCEIVER

BACKGROUND

Field

Aspects of the present disclosure relate generally to wireless communications, and, more particularly, to an interface for a transceiver.

Background

A wireless device includes a transceiver for transmitting and receiving radio frequency (RF) signals via one or more antennas. The transceiver may include a power amplifier (PA) configured to amplify an RF signal for transmission via an antenna and a low-noise amplifier (LNA) configured to amplify an RF signal received by the antenna. The transceiver may also include an interface circuit configured to couple the PA and the LNA to the antenna.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a transformer including a first inductor, a second inductor, and a third inductor. The apparatus also includes a power amplifier having an output coupled to the first inductor, a low-noise amplifier having an input coupled to a first terminal of the third inductor, and a fourth inductor having a first terminal and a second terminal, wherein the second terminal of the fourth inductor is coupled to a second terminal of the third inductor. The apparatus also includes a switch coupled between the first terminal of the third inductor and the first terminal of the fourth inductor.

A second aspect relates to a method for operating a transceiver. The transceiver includes a transformer, a power amplifier, and a low-noise amplifier, wherein the transformer includes a first inductor coupled to an output of the power amplifier, a second inductor coupled to an antenna, and a third inductor coupled to an input of the low-noise amplifier. The method includes, in a transmit mode, coupling a fourth inductor to the third inductor of the transformer, amplifying a first radio frequency (RF) signal using the power amplifier, and coupling the first RF signal from the power amplifier to the antenna via the transformer. The method also includes, in a receive mode, decoupling the fourth inductor from the third inductor of the transformer, coupling a second RF signal received by the antenna to the low-noise amplifier via the transformer, and amplifying the second RF signal using the low-noise amplifier.

A third aspect relates to an apparatus. The apparatus includes antennas, power amplifiers, low-noise amplifiers, and interface circuits. Each of the interface circuits includes a respective transformer including a respective first inductor, a second respective inductor, and a respective third inductor, wherein the respective first inductor is magnetically coupled with the respective second inductor, the respective second inductor is magnetically coupled with the respective third inductor, the respective first inductor is coupled to an output of a respective one of the power amplifiers, the respective second inductor is coupled to a respective one of the antennas, and the respective third inductor has a first terminal coupled to an input of a respective one of the low-noise amplifiers. Each of the interface circuits also includes a respective fourth inductor having a first terminal and a second terminal, wherein the second terminal of the respective fourth inductor is coupled to a second terminal of the respective third inductor, and a respective switch coupled between the first terminal of the respective third inductor and the first terminal of the respective fourth inductor.

A fourth aspect relates to an apparatus. The apparatus includes a transformer including a first inductor, a second inductor, and a third inductor, wherein the first inductor is magnetically coupled with the second inductor, and the second inductor is magnetically coupled with the third inductor. The apparatus includes means for driving the first inductor with a first radio frequency (RF) signal in a transmit mode, means for amplifying a second RF signal received via the third inductor in a receive mode, means for coupling a first terminal of a fourth inductor to a first terminal of the third inductor in the transmit mode, and means for decoupling the first terminal of the fourth inductor from the first terminal of the third inductor in the receive mode, wherein a second terminal of the fourth inductor is coupled to a second terminal of the third inductor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
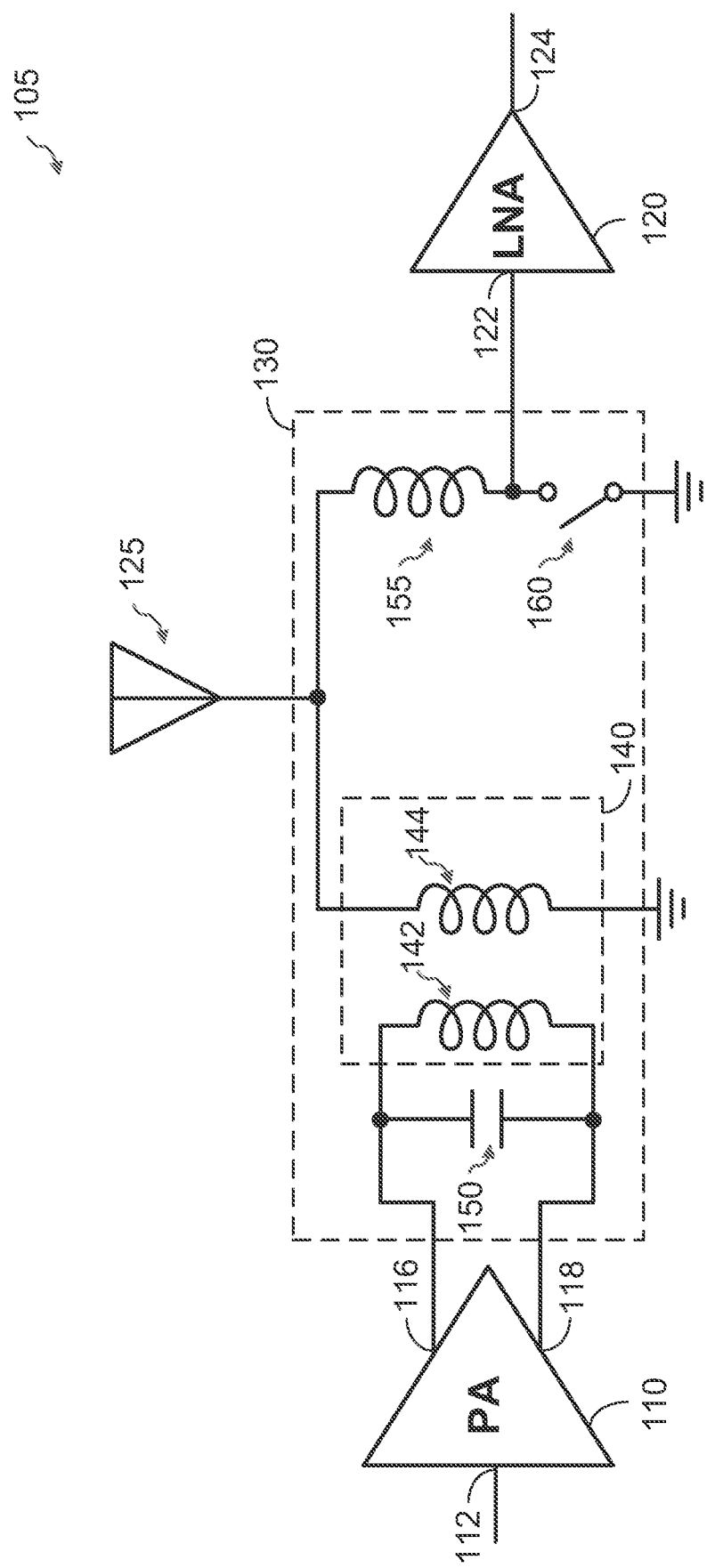
FIG. 1 shows an example of a transceiver coupled to an antenna according to certain aspects of the present disclosure.

FIG. 1 shows an example of a wireless device 105 according to certain aspects. The wireless device 105 includes a power amplifier (PA) 110, a low-noise amplifier (LNA) 120, an interface circuit 130, and an antenna 125. The PA 110 and the LNA 120 may be part of a transceiver configured to transmit and receive radio frequency (RF) signals via one or more antennas including the antenna 125. The PA 110 is configured to amplify an RF signal for transmission via the antenna 125 and the LNA 120 is configured to amplify an RF signal received by the antenna 125. The interface circuit 130 is configured to couple the PA 110 and the LNA 120 to the antenna 125. Although one PA 110, one LNA 120, and one antenna 125 are shown in FIG. 1, it is to be appreciated that the wireless device 105 may include multiple PAs, multiple LNAs, and multiple antennas.

In certain aspects, the PA 110 and the LNA 120 may be configured to transmit and receive RF signals in the millimeter wave (mmWave) band (e.g., above 24 GHz), which supports high data rates. Operating in the mmWave band allows the use of small antennas, which allow the wireless device 105 to employ one or more antenna arrays (e.g., for high directivity and antenna gain). However, it is to be appreciated that the present disclosure is not limited to the mmWave band.

In the example in FIG. 1, the PA 110 is a differential power amplifier having an input 112 and a differential output, in which the differential output includes a first output 116 and a second output 118. In this example, the PA 110 is configured to receive an RF signal at the input 112 (e.g., from a mixer or another circuit), amplify the RF signal, and output the amplified RF signal at the differential output. In certain aspects, the PA 110 may be implemented with two or more amplifiers. The input 112 may be a single-ended input or a differential input.

The LNA 120 has an input 122 and an output 124. The LNA 120 is configured to receive an RF signal at the input 122, amplify the received RF signal, and output the amplified RF signal at the output 124. The output 124 may be coupled to a mixer for frequency down-conversion, a phase shifter, a variable amplifier, an attenuator, and/or one or more other circuits in the transceiver. The output 124 may be a single-ended output or a differential output.

In the example in FIG. 1, the interface circuit 130 includes a transformer 140, a capacitor 150, an impedance-matching inductor 155, and a switch 160. The transformer 140 includes a first inductor 142 and a second inductor 144 magnetically (i.e., inductively) coupled with each other. The first inductor 142 is coupled between the first output 116 and the second output 118 of the PA 110, and the second inductor 144 is coupled between the antenna 125 and a ground (or some reference potential). The transformer 140 is used to provide impedance matching between the differential output of the PA 110 and the antenna 125. The transformer 140 may also transform the differential RF signal at the first inductor 142 into a single-ended RF signal at the second inductor 144 for transmission by the antenna 125.

The capacitor 150 is coupled in parallel with the first inductor 142 and may be used, for example, to set a resonance frequency of the transformer 140. The impedance-matching inductor 155 is coupled between the antenna 125 and the input 122 of the LNA 120. The impedance-matching inductor 155 provides impedance matching between the antenna 125 and the input 122 of the LNA 120. The switch 160 is coupled between the input 122 of the LNA 120 and the ground.

In certain aspects, the wireless device 105 may transmit an RF signal via the antenna 125 and receive an RF signal via the antenna 125 one at a time using time division duplex (TDD). In these aspects, the wireless device 105 transmits an RF signal via the antenna 125 in a transmit mode and receives an RF signal via the antenna 125 in a receive mode.

In the transmit mode, a controller (not shown) turns on the switch 160, which couples the input 122 of the LNA 120 to the ground. The PA 110 then receives an RF signal to be transmitted (e.g., from a mixer or another circuit), amplifies the RF signal, and outputs the amplified RF signal to the transformer 140. The transformer 140 couples the amplified RF signal to the antenna 125 for transmission. The voltage swing of the amplified RF signal output to the antenna 125 (which is shared by the LNA 120) may be much larger than the voltage swing of an RF signal received by the antenna 125. To protect the input 122 of the LNA 120 from the large voltage swing, the switch 160 couples the input 122 of the LNA 120 to the ground (i.e., pulls the input 122 of the LNA 120 to ground) in the transmit mode.

In the receive mode, the controller (not shown) turns off the switch 160, which decouples the input 122 of the LNA 120 from the ground. In the receive mode, the antenna 125 receives an RF signal (e.g., from a base station or another device). The LNA 120 amplifies the received RF signal and outputs the amplified RF signal at the output 124. The amplified RF signal may be output to a mixer (not shown) for frequency down-conversion and/or one or more other circuits in the transceiver.

Figure 2:
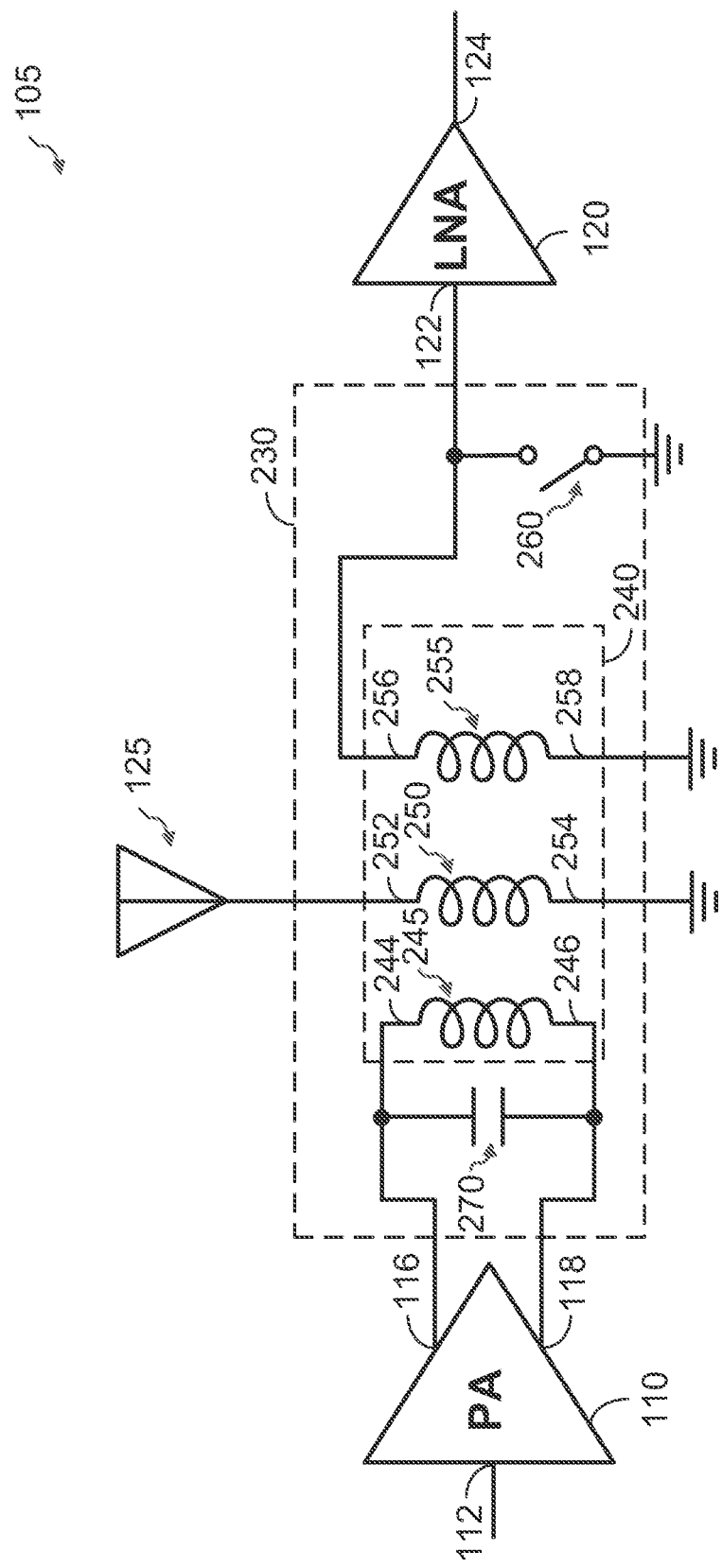
FIG. 2 shows an example of a transceiver including a multi-coil transformer according to certain aspects of the present disclosure.

FIG. 2 shows another exemplary implementation of an interface circuit 230 according to certain aspects. In this example, the interface circuit 230 includes a multi-coil transformer 240 (e.g., a tri-coil transformer) in place of the transformer 140 and the impedance-matching inductor 155 shown in FIG. 1. The multi-coil transformer 240 couples the PA 110 to the antenna 125 and couples the antenna 125 to the LNA 120, as discussed further below. The multi-coil transformer 240 also provides impedance matching between the PA 110 and the antenna 125 and impedance matching between the antenna 125 and the LNA 120. In contrast, the exemplary interface circuit 130 in FIG. 1 uses separate impedance-matching components for the PA 110 and the LNA 120 (i.e., the transformer 140 and the impedance-matching inductor 155). The multi-coil transformer 240 reduces the area of the interface circuit 230 compared with the interface circuit 130 in FIG. 1 by combining the impedance matching components for the PA 110 and the LNA 120 into the multi-coil transformer 240.

In the example in FIG. 2, the multi-coil transformer 240 includes a first inductor 245, a second inductor 250, and a third inductor 255. The first inductor 245 is coupled between the first output 116 and the second output 118 of the PA 110, the second inductor 250 is coupled between the antenna 125 and a ground (or some reference potential), and the third inductor 255 is coupled between the input 122 of the LNA 120 and the ground. In the example in FIG. 2, the first inductor 245 has a first terminal 244 coupled to the first output 116 of the PA 110 and a second terminal 246 coupled to the second output 118 of the PA 110. The second inductor 250 has a first terminal 252 coupled to the antenna 125 and a second terminal 254 coupled to the ground. The third inductor 255 has a first terminal 256 coupled to the input 122 of the LNA 120 and a second terminal 258 coupled to the ground.

The first inductor 245 and the second inductor 250 are magnetically (i.e., inductively) coupled, and the second inductor 250 and the third inductor 255 are magnetically (i.e., inductively) coupled. There is also magnetic coupling between the first inductor 245 and the third inductor 255. Each of the first inductor 245, the second inductor 250, and the third inductor 255 may be implemented with a coil inductor, a spiral inductor, a loop inductor, a slab inductor, or another type of inductor. It is to be appreciated that each of the first inductor 245, the second inductor 250, and the third inductor 255 may be referred to as a coil even in cases where the inductors are not physically implemented with coils. In the example in FIG. 2, the multi-coil transformer 240 is shown as a tri-coil transformer including three magnetically coupled inductors (i.e., the first inductor 245, the second inductor 250, and the third inductor 255). However, it is to be appreciated that the multi-coil transformer 240 is not limited to this example and may include more than three inductors.

In this example, the interface circuit 230 also includes a capacitor 270 and a switch 260. The capacitor 270 is coupled in parallel with the first inductor 245 and may be used, for example, to set a resonance frequency of the multi-coil transformer 240. The switch 260 is coupled between the input 122 of the LNA 120 and the ground.

As discussed above, the wireless device 105 may employ TDD, in which the wireless device 105 transmits an RF signal via the antenna 125 in the transmit mode and receives an RF signal via the antenna 125 in the receive mode.

In the transmit mode, a controller (not shown) turns on the switch 260, which couples the input 122 of the LNA 120 to the ground. As discussed above, coupling the input 122 of the LNA 120 to the ground protects the input 122 of the LNA 120 from large voltage swings during RF transmission. In the transmit mode, the PA 110 receives an RF signal to be transmitted (e.g., from a mixer or another circuit), amplifies the RF signal, and outputs the amplified RF signal to the multi-coil transformer 240. The multi-coil transformer 240 couples the amplified RF signal to the antenna 125 for transmission via the magnetic coupling between the first inductor 245 and the second inductor 250.

In the receive mode, the controller (not shown) turns off the switch 260, which decouples the input 122 of the LNA 120 from the ground. In the receive mode, the antenna 125 receives an RF signal (e.g., from a base station or another device). The multi-coil transformer 240 couples the received RF signal to the input 122 of the LNA 120 via the magnetic coupling between the second inductor 250 and the third inductor 255. The LNA 120 amplifies the received RF signal and outputs the amplified RF signal at the output 124. The amplified RF signal may be output to a mixer (not shown) for frequency down-conversion and/or one or more other circuits in the transceiver.

Thus, the multi-coil transformer 240 couples the PA 110 to the antenna 125 and couples the antenna 125 to the LNA 120. In addition, the multi-coil transformer 240 reduces the area of the interface circuit 230 compared with the interface circuit 130 in FIG. 1 by combining the impedance matching components for the PA 110 and the LNA 120 into the multi-coil transformer 240. However, a challenge with using the multi-coil transformer 240 in the interface circuit 230 is that there may be a trade-off between PA performance and LNA performance, as discussed further below.

A high coupling factor k between the second inductor 250 and the third inductor 255 is desirable for LNA performance, where the coupling factor k is a measure of magnetic coupling. This is because a high coupling factor k between the second inductor 250 and the third inductor 255 reduces loss between the antenna 125 and the LNA 120 and improves noise matching, which improve the noise figure of the LNA 120.

A low coupling factor k between the first inductor 245 and the third inductor 255 is desirable for PA performance. This is because the third inductor 255 loads the PA 110, which reduces the amount of power that the multi-coil transformer 240 transfers from the PA 110 to the antenna 125. The higher the coupling factor k between the first inductor 245 and the third inductor 255, the greater the load from the third inductor 255 and therefore the greater the loss between the PA 110 and the antenna 125.

A challenge with designing the multi-coil transformer 240 is that increasing the coupling factor k between the second inductor 250 and the third inductor 255 to improve the noise figure of the LNA 120 has the undesirable effect of increasing the coupling factor k between the first inductor 245 and the third inductor 255, which increases the loss between the PA 110 and the antenna 125. Thus, there is a trade-off for achieving high performance for both the PA 110 and the LNA 120.

Aspects of the present disclosure provide an additional inductor on the receive side that is switchable between the transmit mode and the receive mode by a switch. In the transmit mode, the switch couples the additional inductor to the third inductor 255 of the multi-coil transformer 240, which reduces the effective coupling factor k between the first inductor 245 and the third inductor 255 in the transmit mode, and therefore reduces the loss between the PA 110 and the antenna 125 in the transmit mode for improved PA performance. In the receive mode, the switch decouples the additional inductor from the third inductor 255 of the multi-coil transformer 240 so that the additional inductor has little to no effect on the coupling factor k between the second inductor 250 and the third inductor 255 in the receive mode. This allows the multi-coil transformer 240 to achieve a high coupling factor k between the second inductor 250 and the third inductor 255 in the receive mode for improved LNA performance Thus, aspects of the present disclosure allow the wireless device 105 to achieve high performance for both the PA 110 and the LNA 120, as discussed further below.

Figure 3:
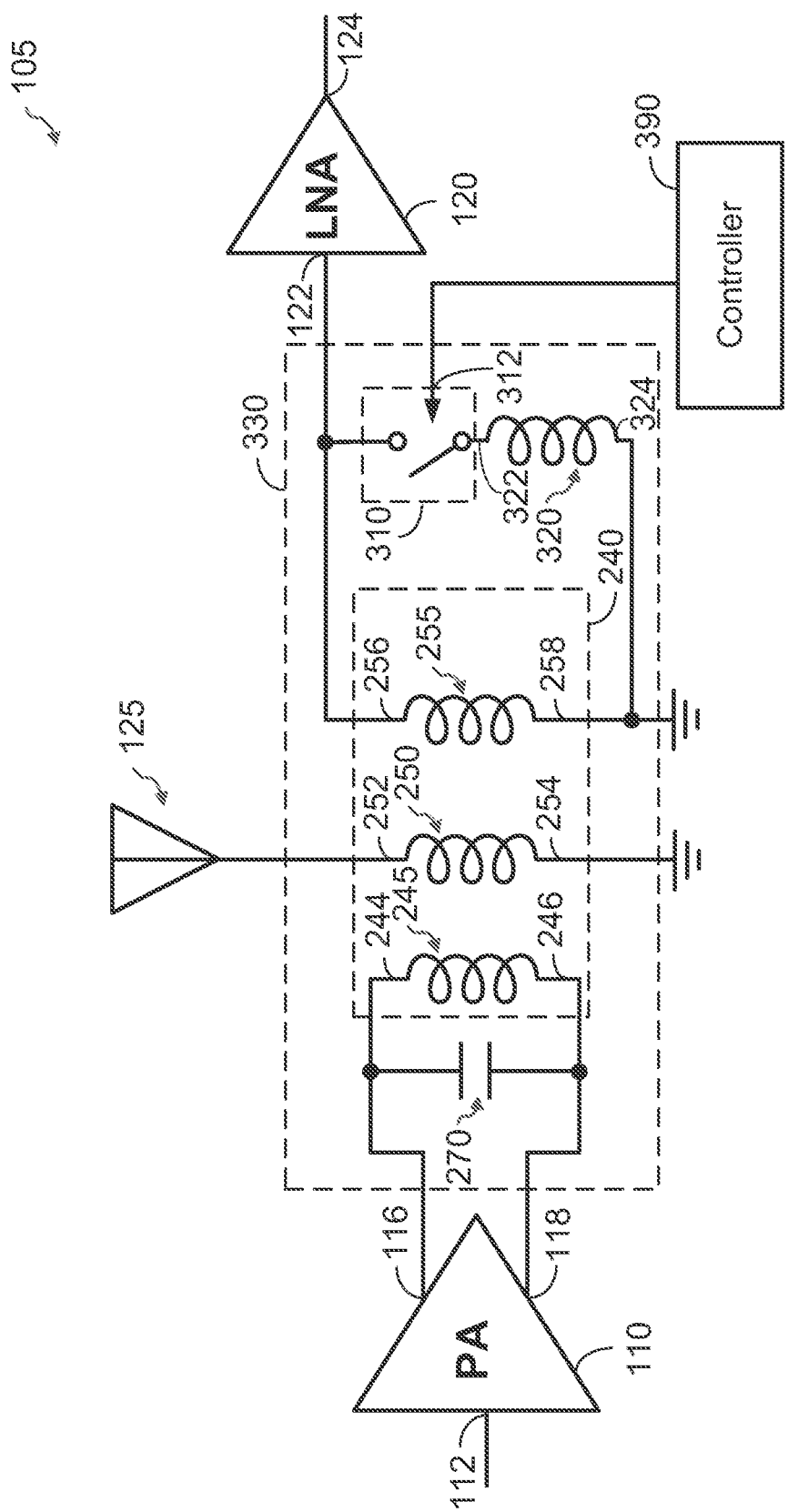
FIG. 3 shows an example of an interface circuit including a switchable inductor according to certain aspects of the present disclosure.

FIG. 3 shows an exemplary interface circuit 330 according to certain aspects of the present disclosure. The interface circuit 330 includes the multi-coil transformer 240 and the capacitor 270 discussed above. The interface circuit 330 also includes an inductor 320 and a switch 310. The switch 310 is coupled between the input 122 of the LNA 120 and a first terminal 322 of the inductor 320. The inductor 320 has a second terminal 324 coupled to the second terminal 258 of the third inductor 255. The second terminal 324 of the inductor 320 is also coupled to the ground (or some reference potential) in this example.

In this example, the wireless device 105 also includes a controller 390 coupled to a control input 312 of the switch 310. As used herein, a "control input" of a switch controls the on/off state of the switch based on a control signal (e.g., voltage or current) input to the control input. As discussed further below, the controller 390 is configured to control the on/off state of the switch 310 via the control input 312.

Figure 4A:
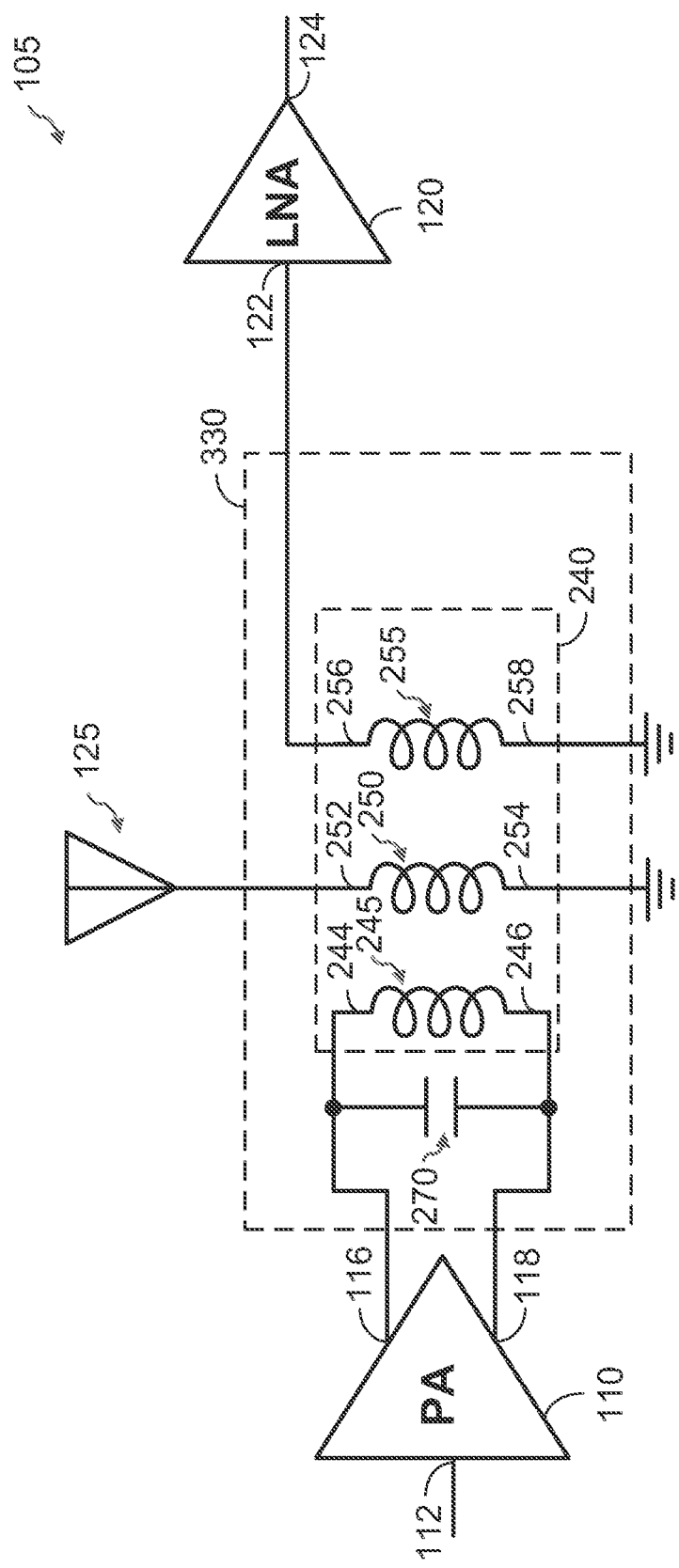
FIG. 4A shows an example of an equivalent circuit of the interface circuit in a receive mode according to certain aspects of the present disclosure.

In the receive mode, the controller 390 turns off (i.e., opens) the switch 310 via the control input 312. As a result, the switch 310 decouples the inductor 320 from the input 122 of the LNA 120. FIG. 4A shows an example of an equivalent circuit of the interface circuit 330 in the receive mode. As shown in FIG. 4A, decoupling the inductor 320 from the input 122 of the LNA 120 effectively removes the inductor 320 so that the inductor 320 has little to no effect on the coupling factor k between the second inductor 250 and the third inductor 255 in the receive mode. In this example, the coupling factor k between the second inductor 250 and the third inductor 255 may be set high to reduce the loss between the antenna 125 and the LNA 120 and improve noise matching in the receive mode, and therefore achieve high performance for the LNA 120. The coupling factor k between the second inductor 250 and the third inductor 255 may be set, for example, by setting the amount of overlap between the second inductor 250 and the third inductor 255 on a chip, the shapes of the second inductor 250 and the third inductor 255, and/or one or more other parameters during the design phase of the multi-coil transformer 240.

Figure 4B:
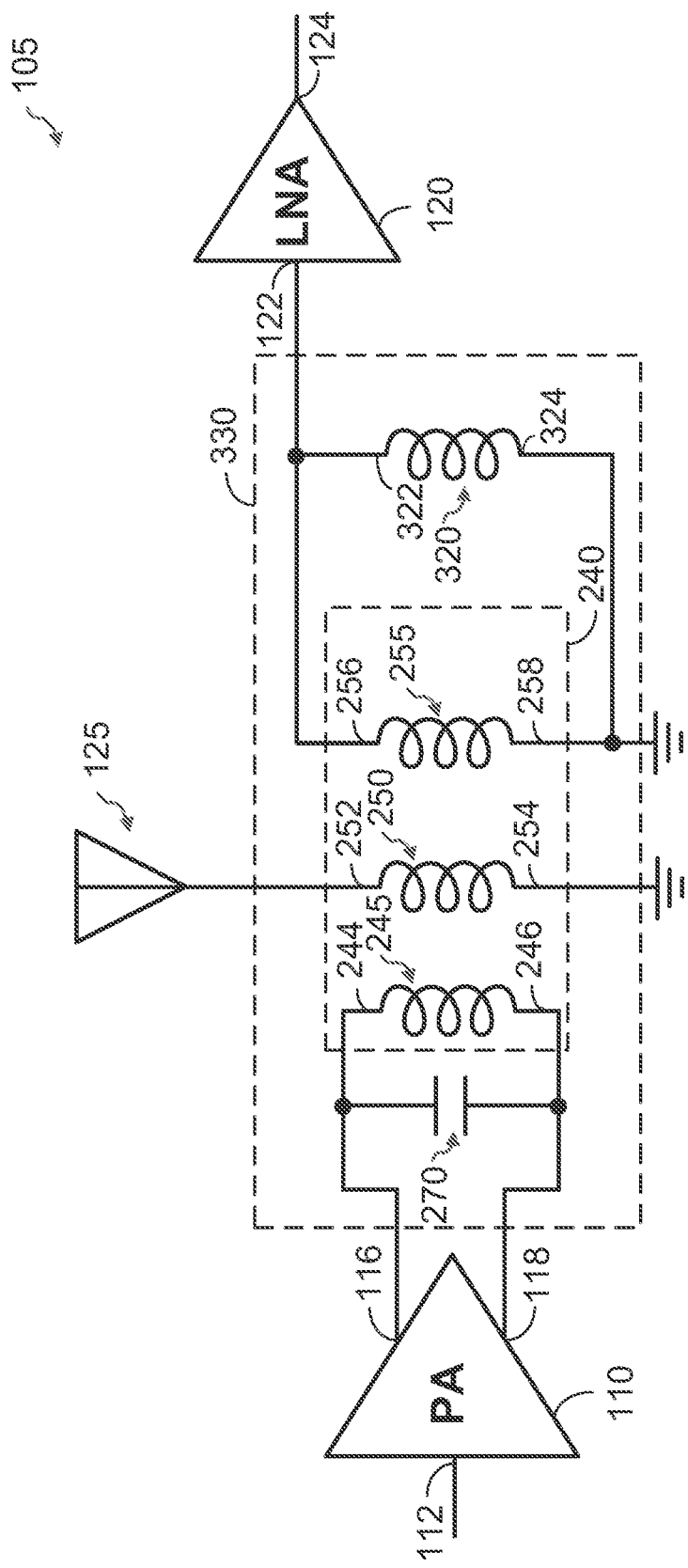
FIG. 4B shows an example of an equivalent circuit of the interface circuit in a transmit mode according to certain aspects of the present disclosure.

In the transmit mode, the controller 390 turns on (i.e., closes) the switch 310 via the control input 312. As a result, the switch 310 couples the inductor 320 in parallel with the third inductor 255. The switch 310 also couples the inductor 320 between the input 122 of the LNA 120 and the ground. FIG. 4B shows an example of an equivalent circuit of the interface circuit 330 in the transmit mode. As shown in FIG. 4B, the inductor 320 is coupled to the third inductor 255 of the multi-coil transformer 240. More particularly, the first terminal 322 of the inductor 320 is coupled to the first terminal 256 of the third inductor 255. Because the inductor 320 is outside the multi-coil transformer 240 (e.g., tri-coil transformer), coupling the inductor 320 to the third inductor 255 reduces the effective coupling factor k between the first inductor 245 and the third inductor 255 in the transmit mode, and therefore reduces the loss between the PA 110 and the antenna 125 in the transmit mode for improved PA performance. The reduction in the effective coupling factor k between the first inductor 245 and the third inductor 255 provided by the inductor 320 in the transmit mode allows the coupling factor k between the second inductor 250 and the third inductor 255 to be high in the receive mode to achieve high performance for the LNA 120 whiling achieve high performance for the PA 110 in the transmit mode.

In this example, the input 122 of the LNA 120 in FIG. 3 may see a larger voltage swing in the transmit mode compared with the input 122 of the LNA 120 in FIG. 2 due to the presence of the inductor 320 in the path between the input 122 of the LNA 120 and the ground. However, the inductor value of the inductor 320 may be chosen such that the voltage swing in the transmit mode stays within the limit of reliability of the LNA 120.

Figure 5:
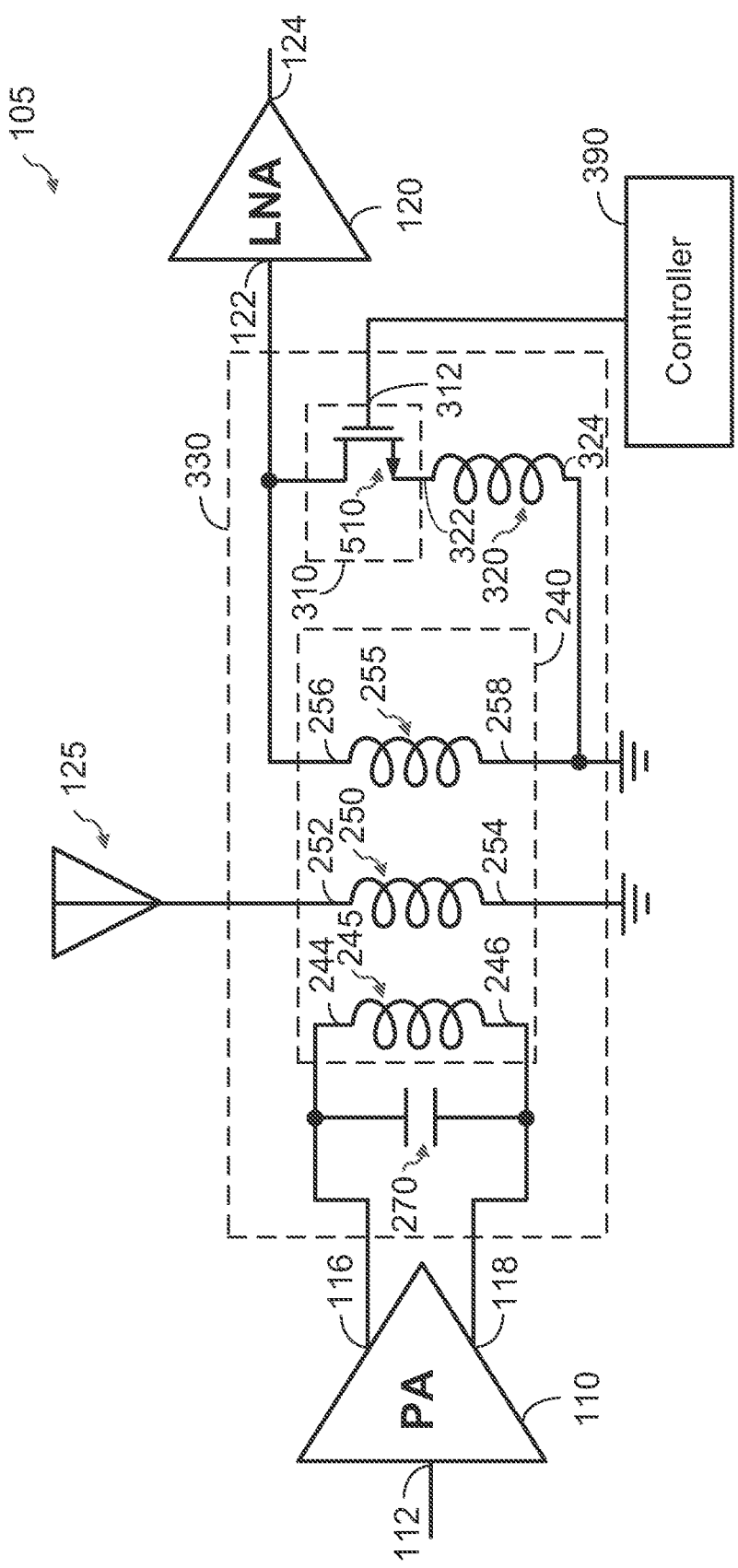
FIG. 5 shows an exemplary implementation of a switch in the interface circuit according to certain aspects of the present disclosure.

FIG. 5 shows an exemplary implementation of the switch 310 according to certain aspects. In this example, the switch 310 includes a transistor 510, in which the drain of the transistor 510 is coupled to the input 122 of the LNA 120, the source of the transistor 510 is coupled to the first terminal 322 of the inductor 320, and the gate of the transistor 510 is coupled to the control input 312 of the switch 310. In the example shown in FIG. 5, the transistor 510 is implemented with an n-type field effect transistor (NFET). However, it is to be appreciated that the transistor 510 is not limited to this example and may be implemented with another type of transistor in other implementations. For the example where the transistor 510 is implemented with the NFET, the controller 390 may turn off the switch 310 by coupling the gate of the transistor 510 to the ground and turn on the switch 310 by outputting a voltage to the gate of the transistor 510 exceeding the threshold voltage of the transistor 510. It is to be appreciated that the switch 310 is not limited to this example. In other examples, the switch 310 may include a transmission gate, or another type of switch.

Figure 6:
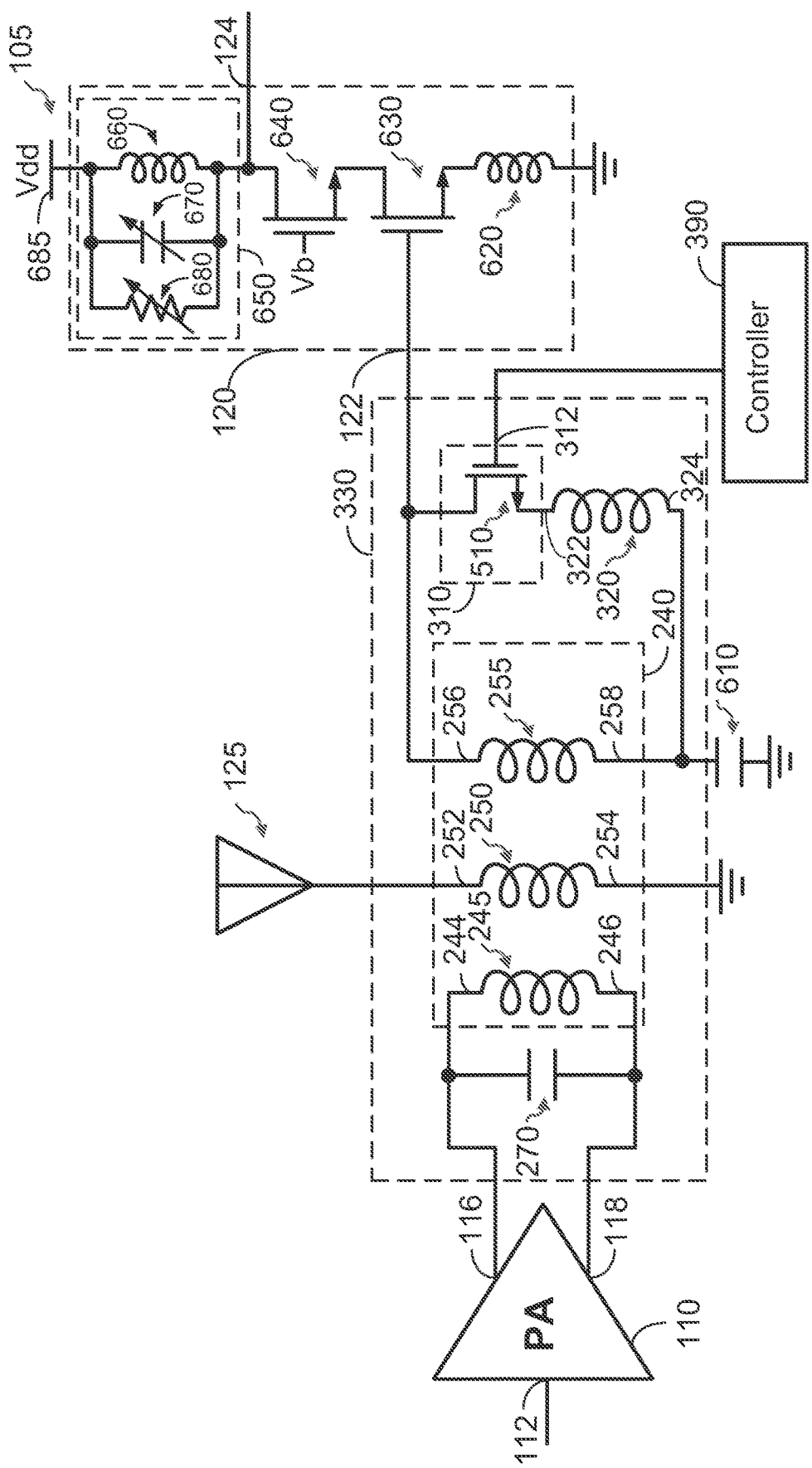
FIG. 6 shows an exemplary implementation of an LNA according to certain aspects of the present disclosure.

FIG. 6 shows an exemplary implementation of the LNA 120 according to certain aspects. In this example, the LNA 120 includes a first transistor 630, a second transistor 640, a source-degenerative inductor 620, and a load 650. In the example shown in FIG. 6, the first transistor 630 is implemented with a first NFET and the second transistor 640 is implemented with a second NFET. However, it is to be appreciated that the first transistor 630 and the second transistor 640 are not limited to this example.

In this example, the gate of the first transistor 630 is coupled to the input 122 of the LNA 120, and the source-degenerative inductor 620 is coupled between the source of the first transistor 630 and the ground. The gate of the second transistor 640 is biased by a bias voltage Vb, the source of the second transistor 640 is coupled to the drain of the first transistor 630, and the drain of the second transistor 640 is coupled to the output 124 of the LNA 120. The load 650 is coupled between a supply rail 685 and the output 124 of the LNA 120. The supply rail 685 has a supply voltage Vdd.

In this example, the first transistor 630 acts as a common-source amplifier with source degeneration provided by the source-degenerative inductor 620. The second transistor 640 acts as a common-gate amplifier that provides a high impedance at the drain of the second transistor 640 for high gain. Together, the first transistor 630 and the second transistor 640 implement a cascode amplifier.

In the example shown in FIG. 6, the load 650 is implemented with a resistor-inductor-capacitor (RLC) tank including a resistor 680, a capacitor 670, and an inductor 660 coupled in parallel. The load 650 has a high impedance at a resonance frequency of the RLC tank, and therefore provides high gain at the resonance frequency of the RLC tank. In the example shown in FIG. 6, the resistor 680 is a variable resistor and the capacitor 670 is a variable capacitor, which allows the resonance frequency of the RLC tank to be tuned by tuning the resistance of the resistor 680 and/or tuning the capacitance of the capacitor 670. In one example, the resonance frequency may be tuned to provide high gain in a desired frequency band.

It is to be appreciated that the LNA 120 is not limited to the example shown in FIG. 6. For example, in some implementations (e.g., non-cascode amplifier), the second transistor 640 may be omitted with the drain of the first transistor 630 coupled to the output 124 of the LNA.

In the example shown in FIG. 6, a capacitor 610 is coupled between the second terminal 324 of the inductor 320 and the ground. Thus, in this example, the second terminal 324 of the inductor 320 is capacitively coupled to the ground via the capacitor 610. In certain aspects, the capacitor 610 may have a high capacitance to provide an alternating-current (AC) ground.

Figure 7A:
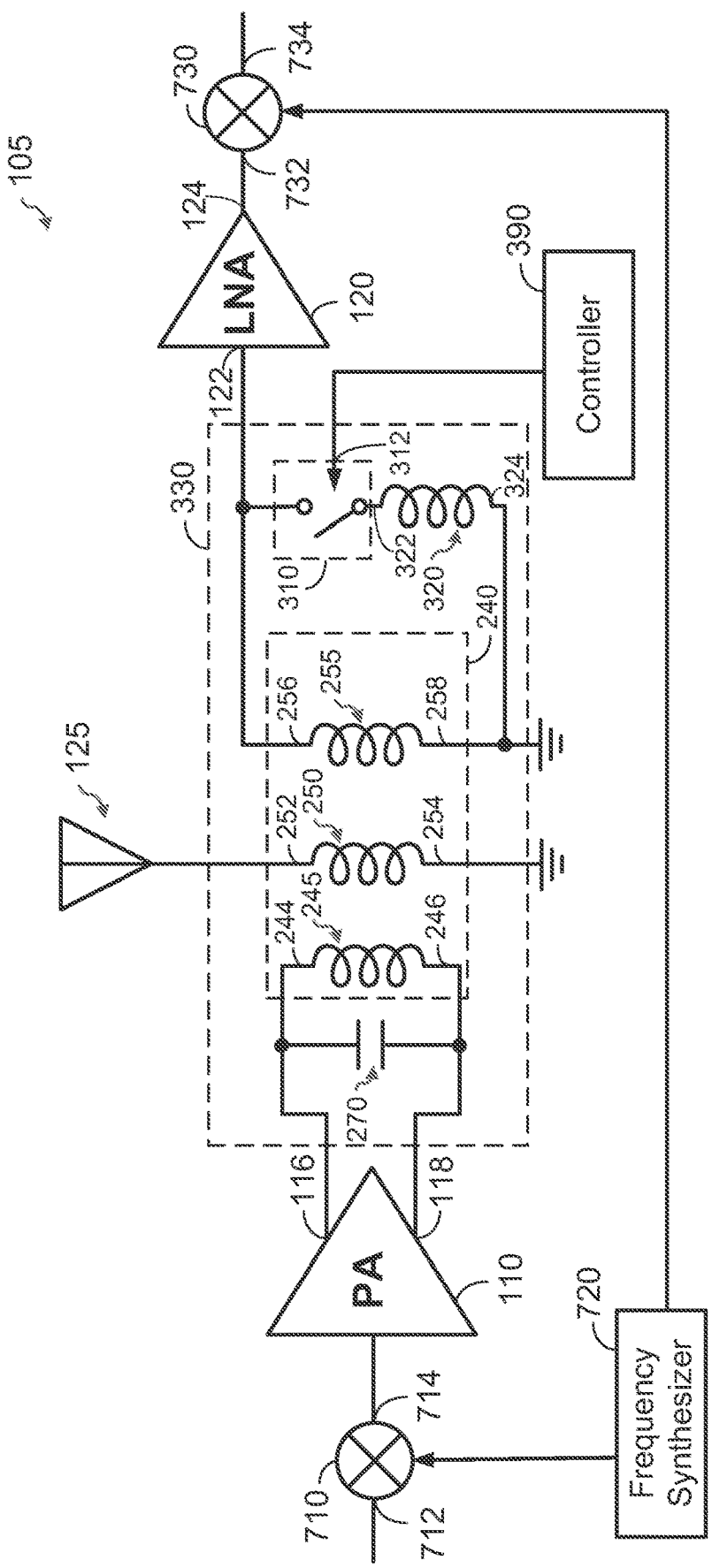
FIG. 7A shows an example of a first mixer coupled to a PA and a second mixer coupled to an LNA according to certain aspects of the present disclosure.

FIG. 7A shows an example in which the wireless device 105 includes a first mixer 710, a second mixer 730, and a frequency synthesizer 720 according to certain aspects. The frequency synthesizer 720 is coupled to the first mixer 710 and the second mixer 730. The frequency synthesizer 720 may be implemented with one or more phase-locked loops or another type of frequency synthesizer.

In this example, the first mixer 710 has an input 712 and an output 714, in which the output 714 is coupled to the input 112 of the PA 110. The frequency synthesizer 720 is configured to generate a first local oscillator (LO) signal and output the first LO signal to the first mixer 710. The first mixer 710 is configured to receive a baseband signal or an intermediate frequency (IF) signal at the input 712, mix the baseband signal or the IF signal with the first LO signal to frequency up-convert the baseband signal or the IF signal into an RF signal, and output the RF signal to the input 112 of the PA 110. It is to be appreciated that the wireless device 105 may include one or more additional components between the first mixer 710 and the PA 110 not shown in FIG. 7A.

In this example, the second mixer 730 has an input 732 and an output 734, in which the input 732 is coupled to the output 124 of the LNA 120. The output 734 may be coupled to one or more filters, an IF circuit, a baseband processor, one or more amplifiers, etc. The frequency synthesizer 720 is configured to generate a second LO signal and output the second LO signal to the second mixer 730. The second mixer 730 is configured to receive the amplified RF signal from the LNA 120 at the input 732, mix the amplified RF signal with the second LO signal to frequency down-convert the amplified RF into a baseband signal or an IF signal, and output the baseband signal or the IF signal at the output 734. It is to be appreciated that the wireless device 105 may include one or more additional components between the LNA 120 and the second mixer 730 not shown in FIG. 7A.

Figure 7B:
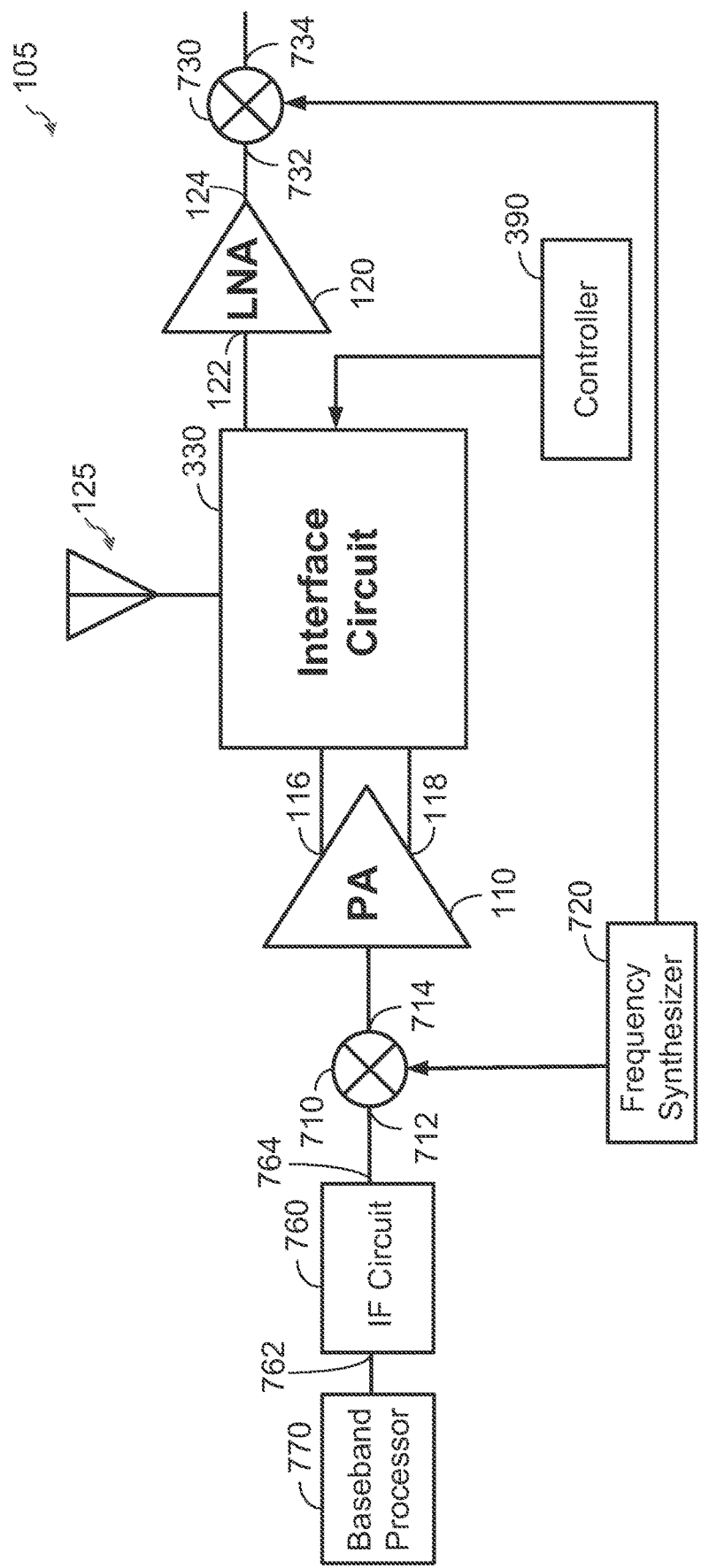
FIG. 7B shows an example of an intermediate frequency circuit coupled to the first mixer according to certain aspects of the present disclosure.

FIG. 7B shows an example in which the wireless device 105 includes an IF circuit 760 according to certain aspects. In this example, the IF circuit 760 has an input 762 coupled to a baseband processor 770, and an output 764 coupled to the input 712 of the first mixer 710. In this example, the baseband processor 770 is configured to output a baseband signal to the input 762 of the IF circuit 760. For example, the baseband processor 770 may receive data and/or control information and process the data and/or control information into the baseband signal. The processing may include modulation, coding, etc.

The IF circuit 760 is configured to receive the baseband signal at the input 762, convert the baseband signal into an IF signal, and output the IF signal at the output 764. For example, the IF circuit 760 may convert the baseband signal into the IF signal by frequency upconverting the baseband signal (e.g., using one or more mixers). The first mixer 710 then mixes the IF signal with the first LO to upconvert the IF signal to the RF signal discussed above. In this example, the IF signal has an intermediate frequency that is between baseband and the frequency of the RF signal.

It is to be appreciated that the IF circuit 760 may be omitted in some implementations. In these implementations, the first mixer 710 may directly unconvert the baseband signal from the baseband processor 770 into the RF signal.

Figure 8:
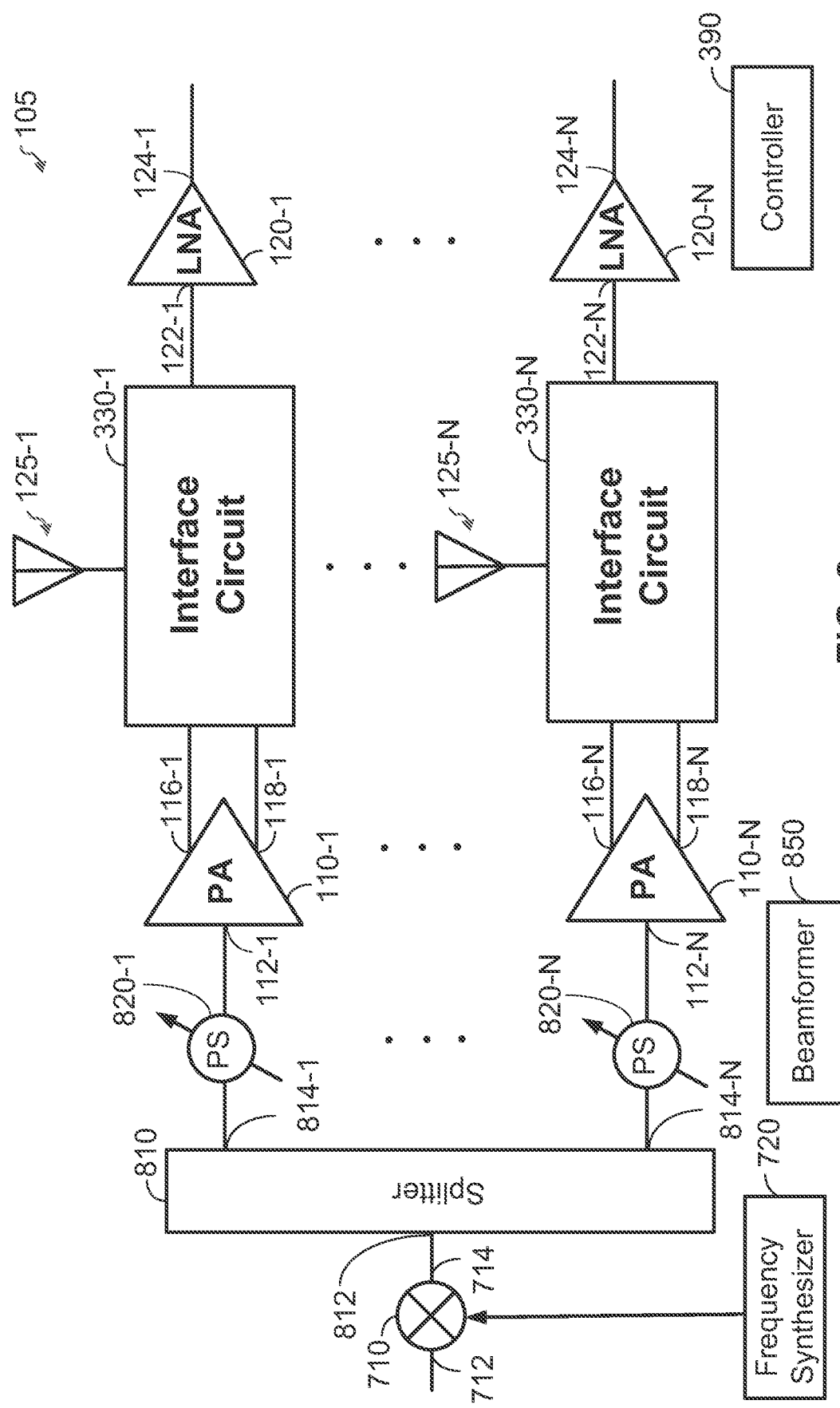
FIG. 8 shows an example of a wireless device including multiple antennas and multiple interface circuits according to certain aspects of the present disclosure.

FIG. 8 shows an example in which the wireless device 105 includes multiple antennas 125-1 to 125-N according to certain aspects. The multiple antennas 125-1 to 125-N may be part of an antenna array that facilitates directional RF transmission and RF reception using beamforming.

In this example, the wireless device 105 includes multiple PAs 110-1 to 110-N, multiple LNAs 120-1 to 120-N, and multiple interface circuits 330-1 to 330-N. Each of the interface circuits 330-1 to 330-N may be implemented with the exemplary interface circuits 330 according to any of the aspects discussed above (i.e., each of the interface circuits 330-1 to 330-N may be a separate instance of the interface circuit 330). Each of the interface circuits 330-1 to 330-N is coupled to a respective one of the antennas 125-1 to 125-N.

In this example, each of the interface circuits 330-1 to 330-N couples the respective one of the antennas 125-1 to 125-N to a respective one of the PAs 110-1 to 110-N and a respective one of the LNAs 120-1 to 120-N. As shown in FIG. 8, the differential output (i.e., first output 116-1 and second output 118-1) of each of the PAs 110-1 to 110-N is coupled to the respective one of the interface circuits 330-1 to 330-N, and the input 122-1 to 122-N of each of the LNAs 120-1 to 120-N is coupled to the respective one of the interface circuits 330-1 to 330-N.

The controller 390 is coupled to the control input 312 of the switch 310 (not shown in FIG. 8) in each of the interface circuits 330-1 to 330-N. For ease of illustration, the individual connections between the controller 390 and the interface circuits 330-1 to 330-N are not shown in FIG. 8. In this example, the controller 390 is configured to turn on the switch 310 in each of the interface circuits 330-1 to 330-N in the transmit mode and turn off the switch 310 in each of the interface circuits 330-1 to 330-N in the receive mode.

In this example, the wireless device 105 also includes a splitter 810 (also referred to as a divider) and multiple phase shifters 820-1 to 820-N for beamforming. The splitter 810 has an input 812 and multiple outputs 814-1 to 814-N. The input 812 of the splitter 810 is coupled to the output 714 of the first mixer 710. Each of the phase shifters 820-1 to 820-N is coupled between a respective one of the outputs 814-1 to 814-N of the splitter 810 and the input 112-1 to 112-N of a respective one of the PAs 110-1 to 110-N.

In the transmit mode, the splitter 810 is configured to receive an RF signal at the input 812 from the first mixer 710. As discussed above, the first mixer 710 mixes a baseband signal or an IF signal with the first LO signal from the frequency synthesizer 720 to generate the RF signal. The splitter 810 is configured to split the RF signal and output the RF signal at each of the outputs 814-1 to 814-N. Each of the phase shifters 820-1 to 820-N is configured to shift the phase of the respective RF signal by a respective phase. The phase shifts of the phase shifters 820-1 to 820-N are controlled by a beamformer 850 to achieve a desired transmit beam direction for the antenna array that includes the antennas 125-1 to 125-N. For ease of illustration, the individual connections between the beamformer 850 and the phase shifters 820-1 to 820-N are not shown in FIG. 8.

Each of the PAs 110-1 to 110-N amplifies the phase-shifted RF signal from the respective one of the phase shifters 820-1 to 820-N and outputs the resulting amplified RF signal to the respective one of the interface circuits 330-1 to 330-N. Each of the interface circuits 330-1 to 330-N couples the respective amplified RF signal to the respective one of the antennas 125-1 to 125-N for transmission.

Figure 9:
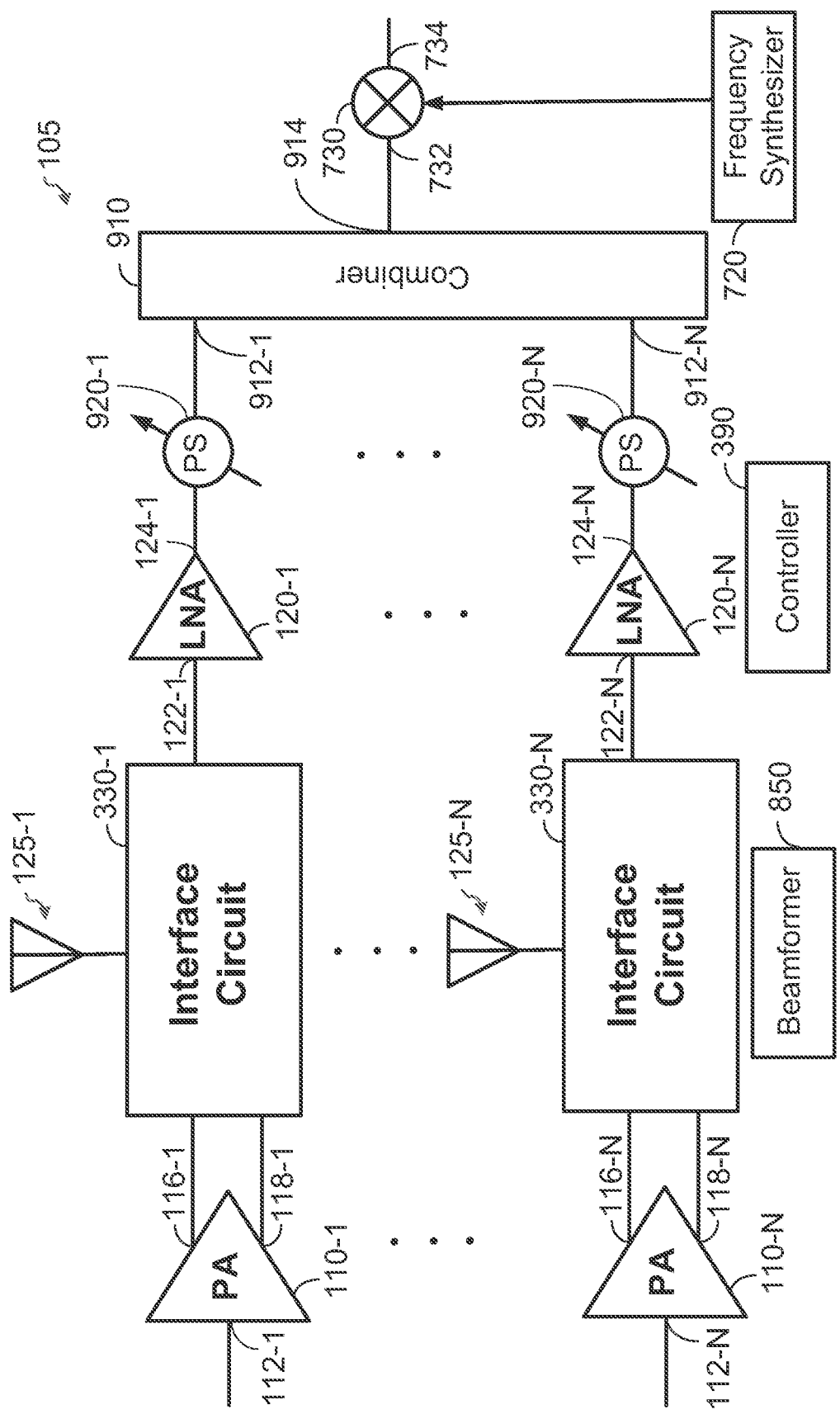
FIG. 9 shows another example of a wireless device including multiple antennas and multiple interface circuits according to certain aspects of the present disclosure.

FIG. 9 shows an example in which the wireless device 105 also includes a combiner 910 and multiple phase shifters 920-1 to 920-N for beamforming. The combiner 910 has multiple inputs 912-1 to 912-N and an output 914. Each of the phase shifters 920-1 to 920-N is coupled between the output 124-1 to 124-N of a respective one of the LNAs 120-1 to 120-N and a respective one of the inputs 912-1 to 912-N of the combiner 910. The output 914 of the combiner 910 is coupled to the input 732 of the second mixer 730.

In the receive mode, each of the LNAs 120-1 to 120-N is configured to receive an RF signal from the respective one of the antennas 125-1 to 125-N via the respective one of the interface circuits 330-1 to 330-N, amplify the respective RF signal, and output the respective amplified RF signal to the respective one of the phase shifters 920-1 to 920-N. Each of the phase shifters 920-1 to 920-N is configured to shift the phase of the respective amplified RF signal by a respective phase. The phase shifts of the phase shifters 920-1 to 920-N are controlled by the beamformer 850 to achieve a desired receive beam direction for the antenna array that includes the antennas 125-1 to 125-N. For ease of illustration, the individual connections between the beamformer 850 and the phase shifters 920-1 to 920-N are not shown in FIG. 9.

The combiner 910 is configured to receive the phase-shifted RF signals at the inputs 912-1 to 912-N, combine the phase-shifted RF signals into a combined RF signal, and output the combined RF signal at the output 914. The second mixer 730 is configured to receive the combined RF signal at the input 732 and mix the combined RF signal with the second LO signal from the frequency synthesizer 720 to generate a baseband signal or an IF signal at the output 734.

It is to be appreciated that the transmit paths and the receive paths in the wireless device 105 may share components (e.g., to reduce area). For example, in some implementations, the phase shifters 920-1 to 920-N in FIG. 9 may be the same as the phase shifters 820-1 to 820-N in FIG. 8. In these implementations, the wireless device 105 may include switches (not shown) configured to couple the phase shifters 820-1 to 820-N between the splitter 810 and the PAs 110-1 to 110-N in the transmit mode and couple the phase shifters 820-1 to 820-N between the LNAs 120-1 to 120-N and the combiner 910 in the receive mode. Similarly, the second mixer 730 may be the same as the first mixer 710 is some implementations. In these implementations, the wireless device 105 may include switches (not shown) configured to couple the first mixer 710 to the splitter 810 in the transmit mode and couple the first mixer 710 to the combiner 910 in the receive mode.

Figure 10:
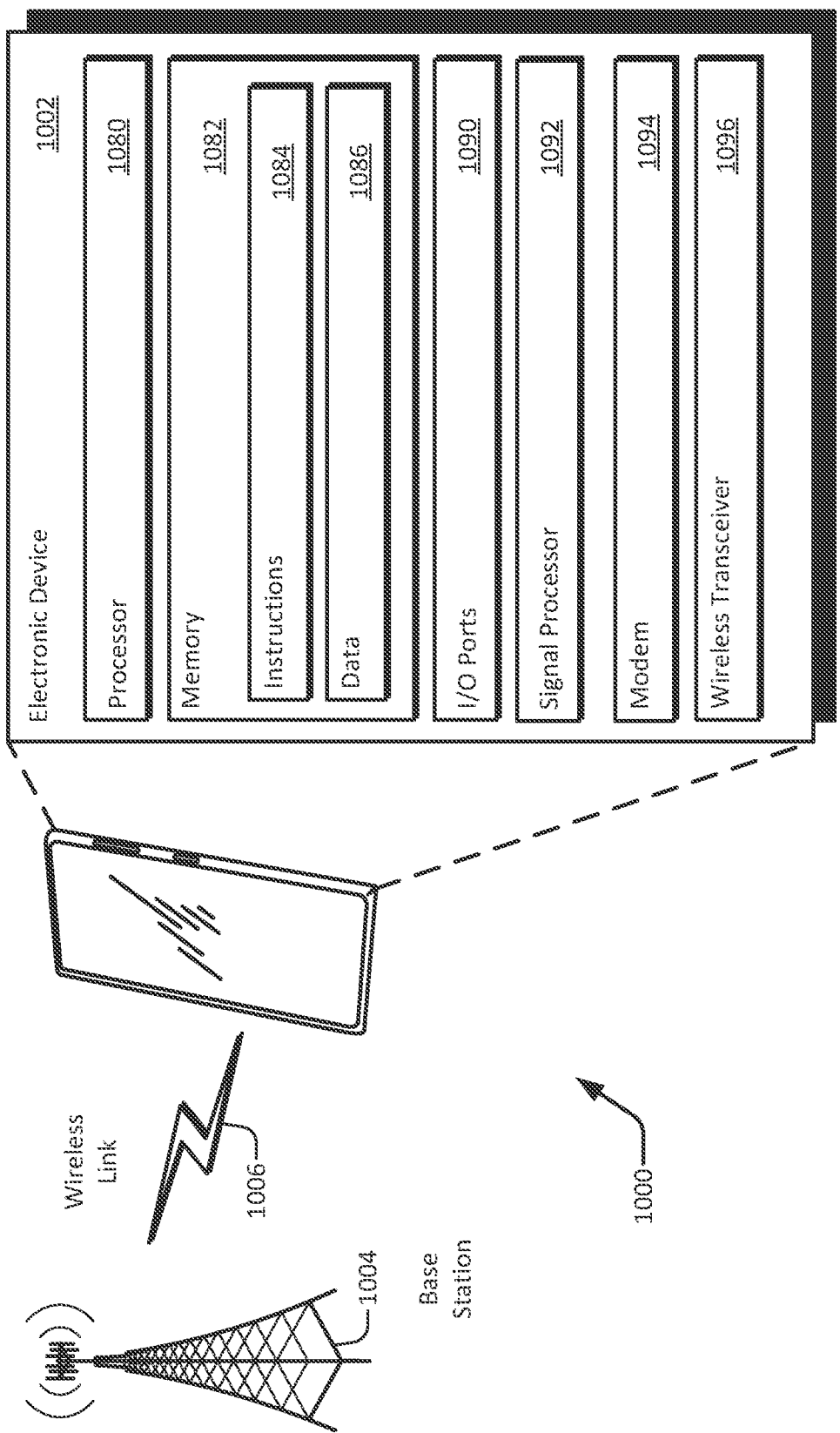
FIG. 10 is a diagram of an environment including an electronic device that includes a transceiver according to certain aspects of the present disclosure.

FIG. 10 is a diagram of an environment 1000 that includes an electronic device 1002 and a base station 1004. The electronic device 1002 may correspond to wireless device 105. The electronic device 1002 includes a wireless transceiver 1096, which may include the PA 110, the PAs 110-1 to 110-N, the LNA 120, the LNAs 120-1 to 120-N, the interface circuit 330, the interface circuits 330-1 to 330-N, the first mixer 710, the frequency synthesizer 720, the IF circuit 760, the controller 390, the splitter 810, the phase shifters 820-1 to 820-N, the beamformer 850, the phase shifters 920-1 to 920-N, the combiner 910, and/or the second mixer 730.

In the environment 1000, the electronic device 1002 communicates with the base station 1004 via a wireless link 1006. As shown, the electronic device 1002 is depicted as a smart phone. However, the electronic device 1002 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1004 communicates with the electronic device 1002 via the wireless link 1006, which may be implemented as any suitable type of wireless link. Although depicted as a base station tower of a cellular radio network, the base station 1004 may represent or be implemented as another device, such as a satellite, terrestrial broadcast tower, access point, peer to peer device, mesh network node, fiber optic line, another electronic device generally as described above, and so forth. Hence, the electronic device 1002 may communicate with the base station 1004 or another device via a wired connection, a wireless connection, or a combination thereof. The wireless link 1006 can include a downlink of data or control information communicated from the base station 1004 to the electronic device 1002 and an uplink of other data or control information communicated from the electronic device 1002 to the base station 1004. The wireless link 1006 may be implemented using any suitable communication protocol or standard, such as 3rd Generation Partnership Project Long-Term Evolution (3GPP LTE, 3GPP NR 5G), IEEE 1002.11, IEEE 1002.11, Bluetooth™, and so forth.

The electronic device 1002 includes a processor 1080 and a memory 1082. The memory 1082 may be or form a portion of a computer readable storage medium. The processor 1080 may include any type of processor, such as an application processor or a multi-core processor, that is configured to execute processor-executable instructions (e.g., code) stored by the memory 1082. The memory 1082 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1082 is implemented to store instructions 1084, data 1086, and other information of the electronic device 1002.

The electronic device 1002 may also include input/output (I/O) ports 1090. The I/O ports 1090 enable data exchanges or interaction with other devices, networks, or users or between components of the device.

The electronic device 1002 may further include a signal processor (SP) 1092 (e.g., such as a digital signal processor (DSP)). The signal processor 1092 may function similar to the processor 1080 and may be capable of executing instructions and/or processing information in conjunction with the memory 1082. The signal processor 1092 may include the baseband processor 770.

For communication purposes, the electronic device 1002 also includes a modem 1094, the wireless transceiver 1096, and one or more antennas (e.g., antenna 125 and/or antennas 125-1 to 125-N). The wireless transceiver 1096 provides connectivity to respective networks and other electronic devices connected therewith using RF wireless signals. The wireless transceiver 1096 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 11:
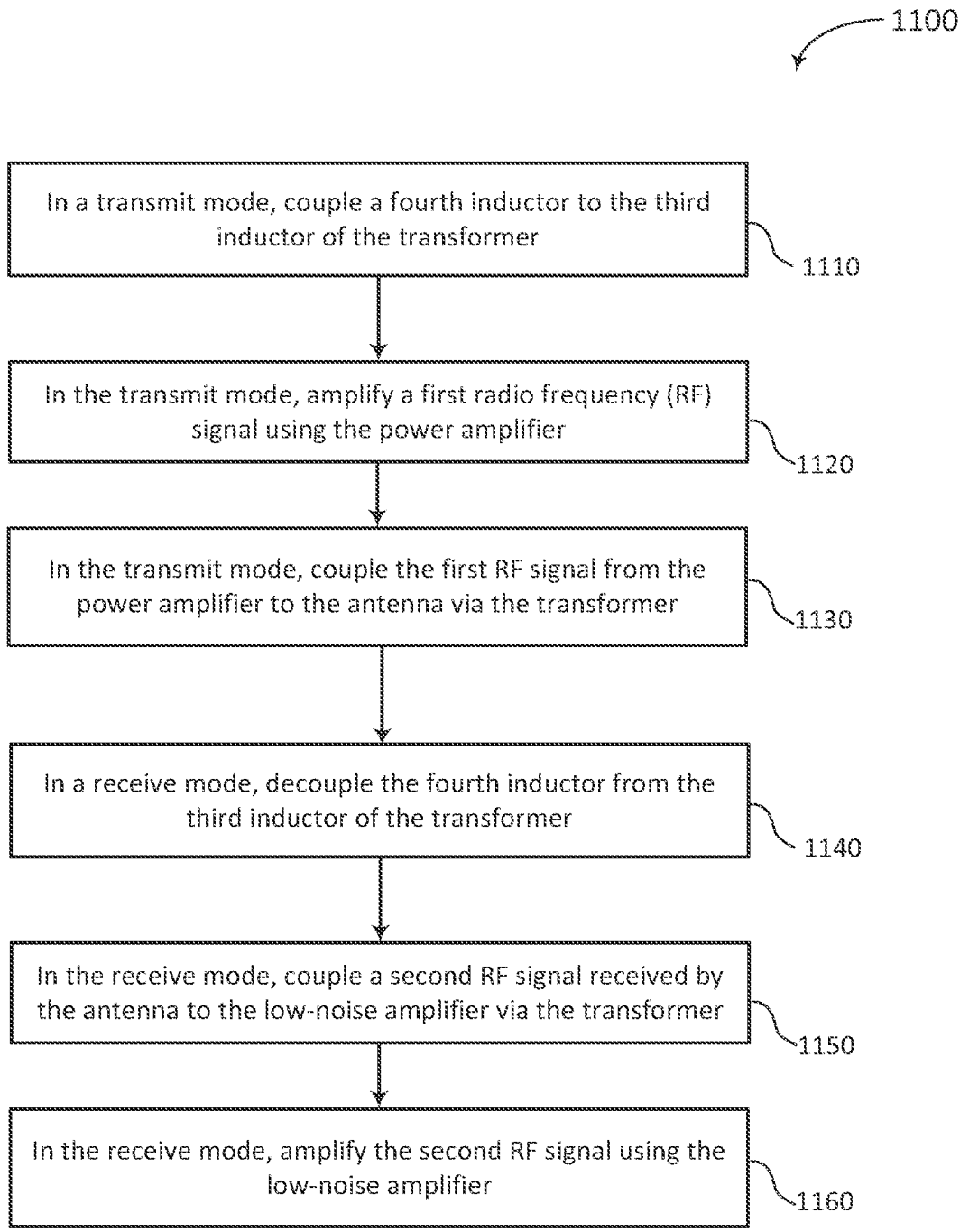
FIG. 11 is a flowchart illustrating a method of operating a transceiver according to certain aspects of the present disclosure.

FIG. 11 illustrates a method 1100 for operating a transceiver according to certain aspects. The transceiver includes a transformer (e.g., multi-coil transformer 240), a power amplifier (e.g., PA 110), and a low-noise amplifier (e.g., LNA 120), wherein the transformer includes a first inductor (e.g., first inductor 245) coupled to an output of the power amplifier, a second inductor (e.g., second inductor 250) coupled to an antenna (e.g., antenna 125), and a third inductor (e.g., third inductor 255) coupled to an input of the low-noise amplifier. The output of the power amplifier may be a differential output (e.g., outputs 116 and 118).

At block 1110, in a transmit mode, a fourth inductor is coupled to the third inductor of the transformer. The fourth inductor may correspond to the inductor 320. In certain aspects, the transceiver includes a switch (e.g., switch 310) between an input (e.g., input 122) of the low-noise amplifier and the fourth inductor. In these aspects, coupling the fourth inductor to the third inductor of the transformer includes turning on the switch. For example, the controller 390 may turn on the switch in the transmit mode.

At block 1120, in the transmit mode, a first radio frequency (RF) signal is amplified using the power amplifier. For example, the PA 110 may receive the first RF signal at the input 112 and amplify the first RF signal.

At block 1130, in the first transmit mode, the first RF signal is coupled from the power amplifier to the antenna via the transformer. For example, the first RF signal may be coupled from a differential output (e.g., the first output 116 and the second output 118) of the power amplifier to the antenna via magnetic coupling between the first inductor and the second inductor of the transformer.

At block 1140, in a receive mode, the fourth inductor is decoupled from the third inductor of the transformer. For the example where the transceiver includes the switch (e.g., switch 310) between the input of the low-noise amplifier and the fourth inductor, decoupling the fourth inductor from the third inductor of the transformer may include turning off the switch. For example, the controller 390 may turn off the switch in the receive mode.

At block 1150, in the receive mode, a second RF signal received by the antenna is coupled to the low-noise amplifier via the transformer. For example, the second RF signal may be coupled from the antenna to the low-noise amplifier via magnetic coupling between the second inductor and the third inductor of the transformer.

At block 1160, in the receive mode, the second RF signal is amplified using the low-noise amplifier. For example, the LNA 120 may receive the second RF signal at the input 122 and amplify the second RF signal.

1. An apparatus, comprising:
   a transformer including a first inductor, a second inductor, and a third inductor;
   a power amplifier having an output coupled to the first inductor;
   a low-noise amplifier having an input coupled to a first terminal of the third inductor;
   a fourth inductor having a first terminal and a second terminal, wherein the second terminal of the fourth inductor is coupled to a second terminal of the third inductor; and
   a switch coupled between the first terminal of the third inductor and the first terminal of the fourth inductor.

2. The apparatus of clause 1, wherein the first inductor is magnetically coupled with the second inductor, and the second inductor is magnetically coupled with the third inductor.

3. The apparatus of clause 1 or 2, wherein the second inductor is coupled to an antenna.

4. The apparatus of clause 3, wherein the second inductor has a first terminal coupled to the antenna and a second terminal coupled to a ground.

5. The apparatus of clause 3 or 4, wherein the antenna is part of an antenna array.

6. The apparatus of any one of clauses 1 to 5, wherein the second terminal of the fourth inductor is coupled to a ground.

7. The apparatus of any one of clauses 1 to 5, further comprising a capacitor coupled between the second terminal of the fourth inductor and a ground.

8. The apparatus of any one of clauses 1 to 7, wherein the output of the power amplifier is a differential output comprising a first output and a second output, and the first inductor is coupled between the first output and the second output.

9. The apparatus of any one of clauses 1 to 8, further comprising a controller coupled to a control input of the switch, wherein the controller is configured to:
   turn on the switch in a transmit mode; and
   turn off the switch in a receive mode.

10. The apparatus of clause 9, wherein the switch comprises a transistor having a gate coupled to the control input of the switch.

11. The apparatus of clause 10, wherein the transistor has a drain coupled to the input of the low-noise amplifier and a source coupled to the first terminal of the fourth inductor.

12. The apparatus of any one of clauses 1 to 11, further comprising a mixer coupled to an input of the power amplifier.

13. The apparatus of clause 12, further comprising an intermediate frequency (IF) circuit having an input and an output, wherein the IF circuit is configured to:
   receive a baseband signal at the input of the IF circuit;
   convert the baseband signal into an IF signal; and
   output the IF signal at the output of the IF circuit, wherein the mixer is coupled between the output of the IF circuit and the power amplifier.

14. The apparatus of any one of clauses 1 to 11, further comprising a phase shifter coupled to an input of the power amplifier.

15. The apparatus of any one of clauses 1 to 11, further comprising a mixer coupled to an output of the low-noise amplifier.

16. The apparatus of any one of clauses 1 to 11, further comprising a phase shifter coupled to an output of the low-noise amplifier.

17. A method for operating a transceiver, the transceiver including a transformer, a power amplifier, and a low-noise amplifier, wherein the transformer includes a first inductor coupled to an output of the power amplifier, a second inductor coupled to an antenna, and a third inductor coupled to an input of the low-noise amplifier, the method comprising:
   in a transmit mode,
   coupling a fourth inductor to the third inductor of the transformer;
   amplifying a first radio frequency (RF) signal using the power amplifier; and
   coupling the first RF signal from the power amplifier to the antenna via the transformer;
   in a receive mode,
   decoupling the fourth inductor from the third inductor of the transformer;
   coupling a second RF signal received by the antenna to the low-noise amplifier via the transformer; and
   amplifying the second RF signal using the low-noise amplifier.

18. The method of clause 17, wherein the transceiver includes a switch between an input of the low-noise amplifier and the fourth inductor, and coupling the fourth inductor to the third inductor of the transformer comprises turning on the switch.

19. The method of clause 18, wherein decoupling the fourth inductor from the third inductor of the transformer comprises turning off the switch.

20. An apparatus, comprising:
  antennas;
  power amplifiers;
  low-noise amplifiers;
  interface circuits, wherein each of the interface circuits comprises:
    a respective transformer including a respective first inductor, a second respective inductor, and a respective third inductor, wherein the respective first inductor is magnetically coupled with the respective second inductor, the respective second inductor is magnetically coupled with the respective third inductor, the respective first inductor is coupled to an output of a respective one of the power amplifiers, the respective second inductor is coupled to a respective one of the antennas, and the respective third inductor has a first terminal coupled to an input of a respective one of the low-noise amplifiers;
    a respective fourth inductor having a first terminal and a second terminal, wherein the second terminal of the respective fourth inductor is coupled to a second terminal of the respective third inductor; and
    a respective switch coupled between the first terminal of the respective third inductor and the first terminal of the respective fourth inductor.

21. The apparatus of clause 20, wherein, in each of the interface circuits, the respective second inductor is coupled between the respective one of the antennas and a ground.

22. The apparatus of clause 20 or 21, wherein, in each of the interface circuits, the second terminal of the respective fourth inductor is coupled to a ground.

23. The apparatus of clause 20 or 21, wherein, each of the interface circuit further comprises a respective capacitor coupled between the second terminal of the respective fourth inductor and a ground.

24. The apparatus of any one of clauses 20 to 23, further comprising a controller configured to:
  turn on the respective switch of each of the interface circuits in a transmit mode; and
  turn off the respective switch of each of the interface circuits in a receive mode.

25. The apparatus of any one of clauses 20 to 24, further comprising:
  a splitter having multiple outputs; and
  phase shifters, wherein each of the phase shifters is coupled between a respective one of the outputs of the splitter and a respective one of the power amplifiers.

26. The apparatus of clause 25, further comprising a mixer coupled to an input of the splitter.

27. An apparatus, comprising:
  a transformer including a first inductor, a second inductor, and a third inductor, wherein the first inductor is magnetically coupled with the second inductor, and the second inductor is magnetically coupled with the third inductor;
  means for driving the first inductor with a first radio frequency (RF) signal in a transmit mode;
  means for amplifying a second RF signal received via the third inductor in a receive mode;
  means for coupling a first terminal of a fourth inductor to a first terminal of the third inductor in the transmit mode; and
  means for decoupling the first terminal of the fourth inductor from the first terminal of the third inductor in the receive mode;
  wherein a second terminal of the fourth inductor is coupled to a second terminal of the third inductor.

28. The apparatus of clause 27, wherein the second inductor is coupled to an antenna.

29. The apparatus of clause 27 or 28, wherein the second terminal of the fourth inductor is coupled to a ground.

30. The apparatus of clause 27 or 28, further comprising a capacitor coupled between the second terminal of the fourth inductor and a ground.

The controller 390 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

It is to be appreciated that the present disclosure is not limited to the exemplary terminology used above to describe aspects of the present disclosure. For example, an inductor of a transformer may also be referred to as a winding or another term. Also, it is to be appreciated that an inductor may be referred to as a coil even in cases where the inductor is not physically implemented with a coil. Also, it is to be appreciated that the inductor 320 may be referred to as a fourth inductor and that referring to the inductor 320 as the fourth inductor does not exclude the possibility of the multi-coil transformer 240 from including more than three inductors.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. An AC ground may be provided by a DC voltage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
  a transformer including a first inductor, a second inductor, and a third inductor;
  a power amplifier having an output coupled to the first inductor;
  a low-noise amplifier having an input coupled to a first terminal of the third inductor;
  a fourth inductor having a first terminal and a second terminal, wherein the second terminal of the fourth inductor is coupled to a second terminal of the third inductor; and a switch coupled between the first terminal of the third inductor and the first terminal of the fourth inductor.

2. The apparatus of claim 1, wherein the first inductor is magnetically coupled with the second inductor, and the second inductor is magnetically coupled with the third inductor.

3. The apparatus of claim 1, wherein the second inductor is coupled to an antenna.

4. The apparatus of claim 3, wherein the second inductor has a first terminal coupled to the antenna and a second terminal coupled to a ground.

5. The apparatus of claim 3, wherein the antenna is part of an antenna array.

6. The apparatus of claim 1, wherein the second terminal of the fourth inductor is coupled to a ground.

7. The apparatus of claim 1, further comprising a capacitor coupled between the second terminal of the fourth inductor and a ground.

8. The apparatus of claim 1, wherein the output of the power amplifier is a differential output comprising a first output and a second output, and the first inductor is coupled between the first output and the second output.

9. The apparatus of claim 1, further comprising a controller coupled to a control input of the switch, wherein the controller is configured to:
turn on the switch in a transmit mode; and
turn off the switch in a receive mode.

10. The apparatus of claim 9, wherein the switch comprises a transistor having a gate coupled to the control input of the switch.

11. The apparatus of claim 10, wherein the transistor has a drain coupled to the input of the low-noise amplifier and a source coupled to the first terminal of the fourth inductor.

12. The apparatus of claim 1, further comprising a mixer coupled to an input of the power amplifier.

13. The apparatus of claim 12, further comprising an intermediate frequency (IF) circuit having an input and an output, wherein the IF circuit is configured to:
receive a baseband signal at the input of the IF circuit;
convert the baseband signal into an IF signal; and
output the IF signal at the output of the IF circuit, wherein the mixer is coupled between the output of the IF circuit and the power amplifier.

14. The apparatus of claim 1, further comprising a phase shifter coupled to an input of the power amplifier.

15. The apparatus of claim 1, further comprising a mixer coupled to an output of the low-noise amplifier.

16. The apparatus of claim 1, further comprising a phase shifter coupled to an output of the low-noise amplifier.

17. A method for operating a transceiver, the transceiver including a transformer, a power amplifier, and a low-noise amplifier, wherein the transformer includes a first inductor coupled to an output of the power amplifier, a second inductor coupled to an antenna, and a third inductor coupled to an input of the low-noise amplifier, the method comprising:
in a transmit mode,
coupling a fourth inductor to the third inductor of the transformer;
amplifying a first radio frequency (RF) signal using the power amplifier; and
coupling the first RF signal from the power amplifier to the antenna via the transformer;
in a receive mode,
decoupling the fourth inductor from the third inductor of the transformer;
coupling a second RF signal received by the antenna to the low-noise amplifier via the transformer; and
amplifying the second RF signal using the low-noise amplifier.

18. The method of claim 17, wherein the transceiver includes a switch between an input of the low-noise amplifier and the fourth inductor, and coupling the fourth inductor to the third inductor of the transformer comprises turning on the switch.

19. The method of claim 18, wherein decoupling the fourth inductor from the third inductor of the transformer comprises turning off the switch.

20. An apparatus, comprising:
antennas;
power amplifiers;
low-noise amplifiers;
interface circuits, wherein each of the interface circuits comprises:
a respective transformer including a respective first inductor, a second respective inductor, and a respective third inductor, wherein the respective first inductor is magnetically coupled with the respective second inductor, the respective second inductor is magnetically coupled with the respective third inductor, the respective first inductor is coupled to an output of a respective one of the power amplifiers, the respective second inductor is coupled to a respective one of the antennas, and the respective third inductor has a first terminal coupled to an input of a respective one of the low-noise amplifiers;
a respective fourth inductor having a first terminal and a second terminal, wherein the second terminal of the respective fourth inductor is coupled to a second terminal of the respective third inductor; and
a respective switch coupled between the first terminal of the respective third inductor and the first terminal of the respective fourth inductor.

21. The apparatus of claim 20, wherein, in each of the interface circuits, the respective second inductor is coupled between the respective one of the antennas and a ground.

22. The apparatus of claim 20, wherein, in each of the interface circuits, the second terminal of the respective fourth inductor is coupled to a ground.

23. The apparatus of claim 20, wherein, each of the interface circuit further comprises a respective capacitor coupled between the second terminal of the respective fourth inductor and a ground.

24. The apparatus of claim 20, further comprising a controller configured to:
turn on the respective switch of each of the interface circuits in a transmit mode; and
turn off the respective switch of each of the interface circuits in a receive mode.

25. The apparatus of claim 20, further comprising:
a splitter having multiple outputs; and
phase shifters, wherein each of the phase shifters is coupled between a respective one of the outputs of the splitter and a respective one of the power amplifiers.

26. The apparatus of claim 25, further comprising a mixer coupled to an input of the splitter.

27. An apparatus, comprising:
a transformer including a first inductor, a second inductor, and a third inductor, wherein the first inductor is magnetically coupled with the second inductor, and the second inductor is magnetically coupled with the third inductor;

means for driving the first inductor with a first radio frequency (RF) signal in a transmit mode;

means for amplifying a second RF signal received via the third inductor in a receive mode;

means for coupling a first terminal of a fourth inductor to a first terminal of the third inductor in the transmit mode; and means for decoupling the first terminal of the fourth inductor from the first terminal of the third inductor in the receive mode;

wherein a second terminal of the fourth inductor is coupled to a second terminal of the third inductor.

28. The apparatus of claim 27, wherein the second inductor is coupled to an antenna.

29. The apparatus of claim 27, wherein the second terminal of the fourth inductor is coupled to a ground.

30. The apparatus of claim 27, further comprising a capacitor coupled between the second terminal of the fourth inductor and a ground.

\* \* \* \* \*